United States Patent
Herrmann et al.

(10) Patent No.: US 9,818,792 B2
(45) Date of Patent: Nov. 14, 2017

(54) INFRARED SENSOR DEVICE AND METHOD FOR PRODUCING AN INFRARED SENSOR DEVICE

(71) Applicant: Robert Bosch GmbH, Stuttgart (DE)

(72) Inventors: Ingo Herrmann, Friolzheim (DE); Edda Sommer, Stuttgart (DE); Christoph Schelling, Stuttgart (DE); Christian Rettig, Reutlingen (DE); Mirko Hattass, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/400,461

(22) PCT Filed: Apr. 19, 2013

(86) PCT No.: PCT/EP2013/058134
§ 371 (c)(1),
(2) Date: Nov. 11, 2014

(87) PCT Pub. No.: WO2013/171020
PCT Pub. Date: Nov. 21, 2013

(65) Prior Publication Data
US 2015/0137300 A1    May 21, 2015

(30) Foreign Application Priority Data

May 16, 2012   (DE) .................. 10 2012 208 220

(51) Int. Cl.
*H01L 27/146* (2006.01)
*G01J 5/20* (2006.01)
(Continued)

(52) U.S. Cl.
CPC .......... *H01L 27/14649* (2013.01); *G01J 5/20* (2013.01); *H01L 27/1467* (2013.01);
(Continued)

(58) Field of Classification Search
CPC ......... H01L 27/14649; H01L 27/14609; H01L 27/14629; H01L 27/14636;
(Continued)

(56) References Cited

U.S. PATENT DOCUMENTS

| | | | |
|---|---|---|---|
| 6,211,520 B1 * | 4/2001 | Ishikawa .................. | G01J 5/20 250/332 |
| 6,300,632 B1 * | 10/2001 | Liu .......................... | G01J 5/06 250/336.1 |

(Continued)

FOREIGN PATENT DOCUMENTS

| | | |
|---|---|---|
| DE | 692 16 862 T2 | 6/1997 |
| DE | 10 2006 028 435 A1 | 12/2007 |

(Continued)

OTHER PUBLICATIONS

Written Opinion of priority document—PCT/EP2013/058134.*

(Continued)

*Primary Examiner* — Matthew Reames
*Assistant Examiner* — Vincent Wall
(74) *Attorney, Agent, or Firm* — Maginot, Moore & Beck LLP

(57) ABSTRACT

An infrared sensor device includes a semiconductor substrate, at least one sensor element that is micromechanically formed in the semiconductor substrate, and at least one calibration element, which is micromechanically formed in the semiconductor substrate, for the sensor element. An absorber material is arranged on the semiconductor substrate in the area of the sensor element and the calibration element. One cavern each is formed in the semiconductor substrate substantially below the sensor element and substantially below the calibration element. The sensor element and the calibration element are thermally and electrically isolated from the rest of the semiconductor substrate by the caverns.

(Continued)

The infrared sensor device has high sensitivity, calibration functionality for the sensor element, and a high signal-to-noise ratio.

15 Claims, 5 Drawing Sheets

(51) Int. Cl.
  *H01L 31/028* (2006.01)
  *G01J 5/00* (2006.01)
  *G01J 5/06* (2006.01)
(52) U.S. Cl.
  CPC .. *H01L 27/14609* (2013.01); *H01L 27/14629* (2013.01); *H01L 27/14636* (2013.01); *H01L 27/14685* (2013.01); *H01L 31/028* (2013.01); *G01J 2005/0048* (2013.01); *G01J 2005/067* (2013.01)
(58) Field of Classification Search
  CPC ........... H01L 27/14685; H01L 27/1467; H01L 31/08; G01J 5/20; G01J 2005/0048; G01J 2005/067
  See application file for complete search history.

(56) References Cited

U.S. PATENT DOCUMENTS

| | | | |
|---|---|---|---|
| 6,541,298 B2 * | 4/2003 | Iida | G01J 5/10 257/E27.144 |
| 7,361,889 B2 * | 4/2008 | Yamaguchi | H01J 49/0036 250/287 |
| 7,569,820 B2 * | 8/2009 | Iida | G01J 5/02 250/330 |
| 2001/0028035 A1 * | 10/2001 | Iida | G01J 5/10 250/338.4 |
| 2002/0139933 A1 * | 10/2002 | Iida | G01J 5/08 250/338.1 |
| 2002/0195563 A1 | 12/2002 | Iida et al. | |
| 2003/0057372 A1 * | 3/2003 | Iida | H01L 27/14649 250/338.4 |
| 2005/0061980 A1 | 3/2005 | Iida et al. | |
| 2011/0001165 A1 * | 1/2011 | Smith | H01L 31/02024 257/184 |
| 2011/0147869 A1 * | 6/2011 | Lazarov | G01J 5/02 257/432 |

FOREIGN PATENT DOCUMENTS

| | | |
|---|---|---|
| EP | 1 246 251 A2 | 10/2002 |
| WO | 93/25877 A1 | 12/1993 |
| WO | 2005/098380 A1 | 10/2005 |
| WO | 2007/147663 A1 | 12/2007 |

OTHER PUBLICATIONS

International Search Report corresponding to PCT Application No. PCT/EP2013/058134, dated Jun. 14, 2013 (German and English language document) (7 pages).

\* cited by examiner

INFRARED SENSOR DEVICE AND METHOD FOR PRODUCING AN INFRARED SENSOR DEVICE

This application is a 35 U.S.C. §371 National Stage Application of PCT/EP2013/058134, filed on Apr. 19, 2013, which claims the benefit of priority to Serial No. DE 10 2012 208 220.4, filed on May 16, 2012 in Germany, the disclosures of which are incorporated herein by reference in their entirety.

BACKGROUND

The disclosure relates to an infrared sensor device and to a method for producing an infrared sensor device.

Surface micromechanically produced pixel structures are known in the prior art. For example, WO 9325877 discloses thin metal lines embedded in passivation layers of $SiO_2$ or $Si_xN_x$ with a bolometer layer resistance, likewise embedded in passivation layers, which metal lines are connected in an arrangement that, together with a reflection layer at a suitable distance, forms a $\lambda/4$ absorber.

WO 2007147663 discloses the bulk micromechanical production of thermally insulating caverns, over which sensor elements suspended on arms that are as long and thin as possible are produced by structuring the Si or SOI membrane.

Furthermore, an IR sensor array based on an SOI pixel technology with all-round passivation is known. In this IR sensor array, the suspension branches are arranged between the pixel and column or row wiring, the pn junction extending as far as the surface.

SUMMARY

It is an object of the disclosure to provide an improved infrared sensor device.

The object is achieved by an infrared sensor device comprising:
  a semiconductor substrate;
  at least one micromechanically formed sensor element in the semiconductor substrate; and
  at least one micromechanically formed calibration element for the sensor element in the semiconductor substrate, wherein an absorber material of e.g. silicon oxide is arranged on the semiconductor substrate in the region of the sensor element and of the calibration element, wherein a cavern is respectively formed in the semiconductor substrate, substantially below the sensor element and substantially below the calibration element, wherein the sensor element and the calibration element are thermally and electrically separated from the rest of the semiconductor substrate by means of the caverns.

According to a further aspect, the present disclosure provides an infrared sensor array comprising a plurality of infrared sensor devices according to the disclosure.

According to another aspect, the disclosure provides a method for producing an infrared sensor device comprising the steps of:
  providing a semiconductor substrate;
  producing a surface micromechanical membrane with anchor structures;
  introducing dopings into the membrane;
  applying at least two layers of absorber material of e.g. silicon oxide, preferably with a total optical thickness of an odd multiple of one fourth of a wavelength of a radiation to be detected;
  applying and structuring at least two conductive tracks for row and column interconnection;
  structuring a suspension arrangement and introducing sacrificial layer etching holes through the oxide material; and
  time-controlled, preferably isotropic sacrificial layer etching of the membrane at least until the semiconductor substrate is removed below the suspension arrangement.

By means of the caverns, in the infrared sensor device according to the disclosure, thermal insulation, or decoupling, of the sensor element and of the calibration element from the rest of the semiconductor substrate is advantageously provided. In this way, it is advantageously possible to produce a highly sensitive pixel with which a thermal radiation to be detected can be recorded precisely. By means of the calibration element, calibration of the sensor element can advantageously be carried out in the form of eliminating a substrate temperature.

Advantageously, when the infrared sensor device according to the disclosure is used in a thermography camera, a pixel density and an image refresh frequency can be increased. The caverns can advantageously be produced economically by means of an APSM (advanced porous silicon membrane) process.

Dependent claims relate to preferred refinements of the infrared sensor device.

According to a preferred embodiment of the infrared sensor device, the semiconductor substrate is a monocrystalline silicon substrate, in which at least one diode is respectively formed for the sensor element and for the calibration element. The diodes in the sensor element and in the calibration element are well-known semiconductor components, in which a rise in temperature leads to a voltage drop proportional thereto. In this way, a sensing element which has a property varying temperature-dependently in its value is advantageously provided. By the use of monocrystalline silicon as the semiconductor substrate, a temperature-dependent voltage drop can advantageously be generated at the diodes. Furthermore, by the use of a monocrystalline semiconductor substrate, in contrast to a polycrystalline semiconductor material, a significantly improved noise behavior can be achieved. For the disclosure, a temperature change caused by infrared radiation is therefore used in order to evaluate an electrical voltage drop thereby generated at the diode.

According to an advantageous refinement of the infrared sensor device, the sensor element is fastened in two regions on the semiconductor substrate by means of a suspension arrangement. In this way, low thermal coupling to the substrate is advantageously achieved, so that a sensing accuracy for the sensor element is increased.

According to an advantageous refinement of the infrared sensor device, the suspension arrangement is formed substantially symmetrically in the vertical direction, wherein an electrical conductive track in the suspension arrangement is arranged substantially centrally between two substantially equally thick layers of the oxide material, wherein the conductive track is covered laterally by the absorber material, for example an oxide, in particular a silicon oxide. This advantageously results in a stress-symmetrical construction of the suspension structure, so that a compensating deformation of individual elements of the suspension arrangement is reinforced. The coverage by means of the oxide layer constitutes electrical insulation and mechanical protection for the conductive tracks.

Ideally, a sensor element is fully insulated thermally from the semiconductor substrate and is configured to be highly absorbent for infrared radiation, while a calibration element should be thermally short-circuited to the semiconductor substrate and fully transparent for infrared radiation. A preferred embodiment of the infrared sensor device according to the disclosure is therefore distinguished in that the oxide material has a smaller layer thickness in the region of the suspension arrangement of the sensor element and in the region of the diodes of the calibration element than on the rest of the infrared sensor device. Low thermal coupling to the semiconductor substrate can thereby advantageously be provided for the sensor element. In this way, a low radiation sensitivity for the incident radiation, and therefore a good calibration effect, are advantageously provided for the calibration element.

According to a preferred embodiment of the infrared sensor device, the sensor element is thermally decoupled well from the semiconductor substrate. For example, the aforementioned good thermal decoupling may be produced by means of long suspension arrangements with a small cross section, consisting of absorber (for example silicon oxide) and conductive track materials (for example Ti, TiN, Ta, TaN) with a low thermal conductivity, so that a diode temperature due to radiation absorption can be recorded very accurately as a sensor quantity for the sensor element.

According to a preferred embodiment of the infrared sensor device, the calibration element is thermally coupled to the semiconductor substrate. For example, the aforementioned good thermal coupling may be produced by means of direct thermal bridges extending between column or row supply lines and a diode region, which may optionally comprise a highly thermally conductive metallization of, for example, material of the column or row line, from the calibration element to the substrate, so that a substrate temperature can be recorded very accurately as a calibration quantity for the sensor element.

According to an advantageous refinement of the infrared sensor device, an optical thickness of the oxide material arranged on the sensor element substantially corresponds to an odd multiple of one fourth of a wavelength of a radiation to be detected. This constitutes favorable dimensioning of the oxide layer for absorption of the thermal radiation to be detected.

A preferred embodiment of the infrared sensor device comprises a reflector layer on the oxide material on a surface of the sensor element. By means of the reflector layer, advantageously, an absorption path of the radiation to be detected is lengthened, and an absorption factor is thereby increased.

An advantageous refinement of the infrared sensor device is distinguished in that a material of the electrical conductive track is at least one from the group: Ti, TiN, Ta, TaN and/or a combination of these materials. With these materials, or combinations thereof, favorable compromises between electrical conductivity and thermal conduction are achieved, so that the sensor element is advantageously thermally coupled only slightly to the substrate, while the electrical properties are good.

An advantageous refinement of the infrared sensor device is distinguished in that a focusing arrangement for focusing the radiation to be detected by means of the sensor element is formed substantially below the sensor element at the bottom of the cavern. By means of the focusing arrangement, the radiation can be recorded more efficiently, so that an increased signal-to-noise ratio is advantageously obtained for the sensor element.

According to an advantageous refinement of the infrared sensor device, the absorber material, for example of silicon oxide, is formed with bumps on at least one section of a surface of the sensor element and of the calibration element. By this measure, bonding of the sensor and calibration elements to an overlying application-specific integrated circuit (ASIC) is advantageously prevented, should contact take place there. This advantageously results in an increased operational reliability for the infrared sensor device.

Other features and advantages of the present disclosure will be explained below with the aid of embodiments with reference to the figures. In this case, all features described or represented, per se or in any combination, are the subject-matter of the disclosure, irrespective of their wording in the patent claims or the dependency thereof, and independently of their wording or representation in the description and in the figures. The figures are above all intended to illustrate the principles essential to the disclosure, and are not necessarily represented true to scale or geometrically exactly. In the figures, references which are the same denote elements which are the same or functionally the same.

DETAILED DESCRIPTION

Figure 1:
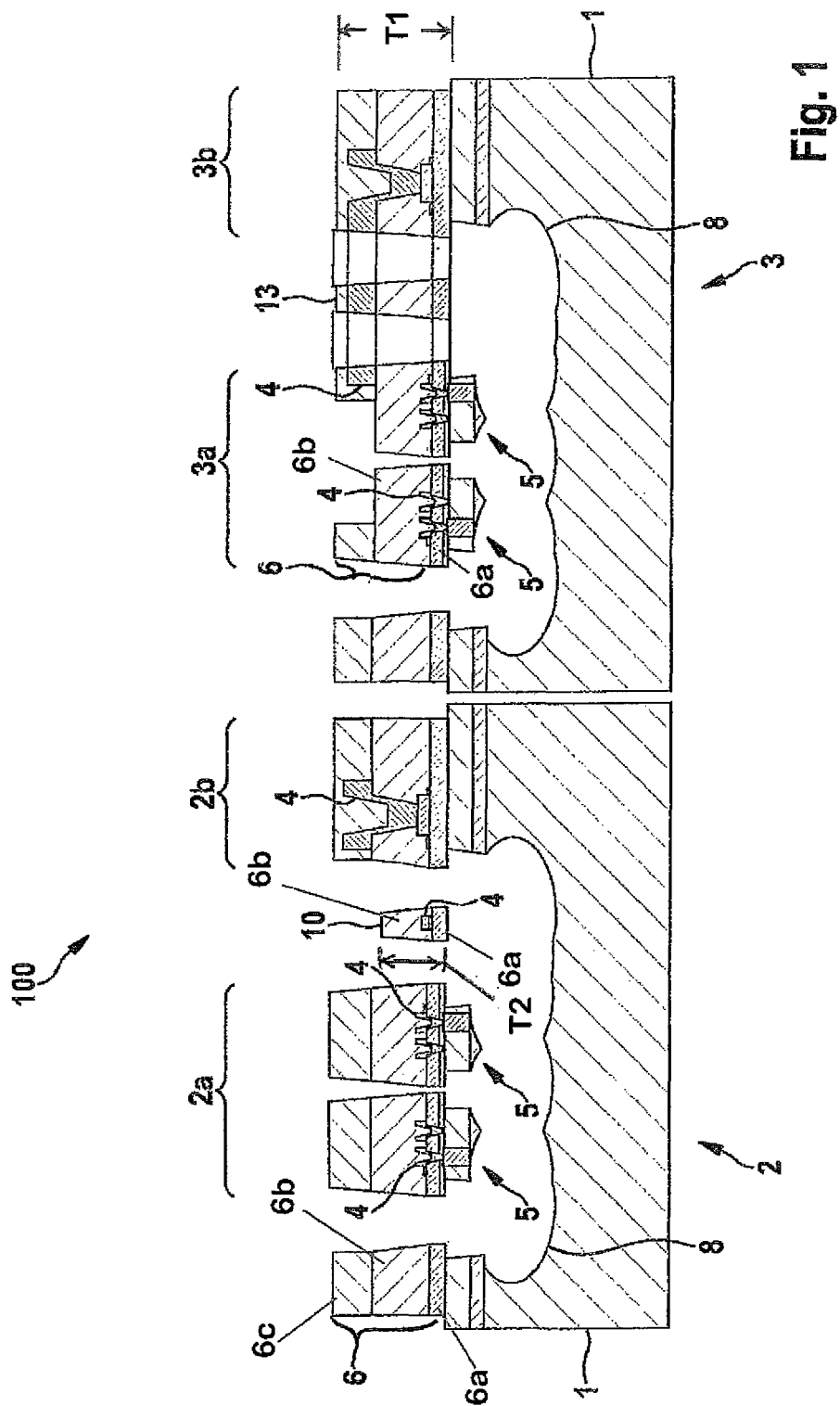
FIG. 1 shows a cross-sectional view of one embodiment of the infrared sensor device according to the disclosure.

FIG. 1 shows an outline cross-sectional view of an embodiment of the infrared sensor device 100 according to the invention. A base material of the infrared sensor device 100 comprises a semiconductor substrate 1, which is preferably formed as a monocrystalline silicon substrate, which advantageously has a significantly lower noise behavior (for example no grain boundary noise) compared with polycrystalline silicon. Applied to a surface of the semiconductor substrate 1, there are a plurality of layers 6a, 6b, 6c of the oxide material 6, which are used as an absorption volume for a thermal radiation to be detected (in particular an infrared radiation) in a pixel region 2a. The oxide layers comprise a metallization plane with conductive tracks 4 for the electrical supply of a sensor element 2. A surface of the infrared sensor device 100 is preferably passivated with a thermally grown oxide material 6. This constitutes a protective layer for the surface and advantageously produces few surface defects.

The sensor element 2 comprises at least one semiconductor diode, the aforementioned monocrystalline silicon substrate being used as the base material of the diode 5. The sensor element 2 is thermally insulated inside the semiconductor substrate 1 from the rest of the substrate by a cavern 8, which is formed substantially below the sensor element 2.

A suspension arrangement 10 for the sensor element 2 is formed by at least two layers 6a, 6b of oxide material 6 exposed all around, a conductive track 4 for the electrical supply of the sensor element 2 being arranged between the layers. It can be seen that the diodes 5 are arranged substantially below the conductive tracks 4, which advantageously constitutes short electrical conduction paths for the driving of the diodes 5. In vertical orientation, the suspension arrangement 10 is constructed substantially symmetrically, a total thickness T2 of the oxide material 6 being less in the region of the suspension arrangement 10 than the total thickness T1 in the pixel region 2*a* of the sensor element 2. In this way, thermal coupling of the suspension arrangement 10 can advantageously be kept low by virtue of a small cross-sectional area. Owing to the symmetrical construction of the suspension arrangement 10, a reduced basic deflection after the suspension arrangement 10 is etched free is furthermore reinforced, because mechanical stress states of the individual oxide layers can mutually compensate. As a result, together with an increased absorber layer thickness with the oxide material 6 in the pixel region 2*a*, an improved signal-to-noise ratio (SNR) of the infrared sensor device 100 can be achieved. Advantageously, a highly sensitive infrared sensor device 100 can thereby be provided.

A conductive track 4 preferably comprises one single layer or multiple layers of a combination of the following materials: Ti, TiN, Ta, TaN. All these materials advantageously represent a favorable compromise between electrical conductivity and thermal conduction, so that strong thermal coupling of the sensor element 2 to the semiconductor substrate 1 can be avoided by using them. A conductive track 4 advantageously has a cross section of less than about 0.1 µm².

A total optical thickness of the oxide layers on the sensor element 2 corresponds substantially to an odd multiple of one fourth of the wavelength $\lambda$ of the radiation to be detected, which is known to be particularly favorable for the absorption. Between a surface of the sensor element 2 and a facing ASIC surface (not represented), a distance of one fourth of the wavelength to be detected may advantageously be set by an outer bond frame (not represented).

A calibration element 3, which may be regarded as a reference element for the sensor element 2 of the infrared sensor device 100, is in principle constructed identically to the sensor element 2, with the difference that the calibration element 3 has good thermal coupling to the semiconductor substrate 1. This may, for example, be provided by thermal bridges 13 extending directly on the shortest path between column or row line region 20 (FIG. 2) and diode regions 5, which may furthermore contain highly thermally conductive metal structures 4 consisting of, for example, column or row metallization, which constitute a suspension structure with a large cross section for the calibration element 3.

A reduced sensitivity of the calibration element 3 for thermal radiation ("thermal blindness") is achieved by a reduced thickness T2 of the oxide material 6 in a pixel region 3*a* of the calibration element 3. By means of the calibration element 3, a background substrate temperature of the semiconductor substrate 1 can be recorded, so that the fact that the substrate itself also acts as a thermal radiator is taken into account. By taking the difference between sensor signals of the sensor element 2 and of the calibration element 3, the effect of the semiconductor substrate temperature can be substantially eliminated in this way by a kind of calibration, or offset correction, of the sensor element 2 with the calibration element 3. As a result, a maximal working signal of the sensor element 2 can be generated.

Figure 2:
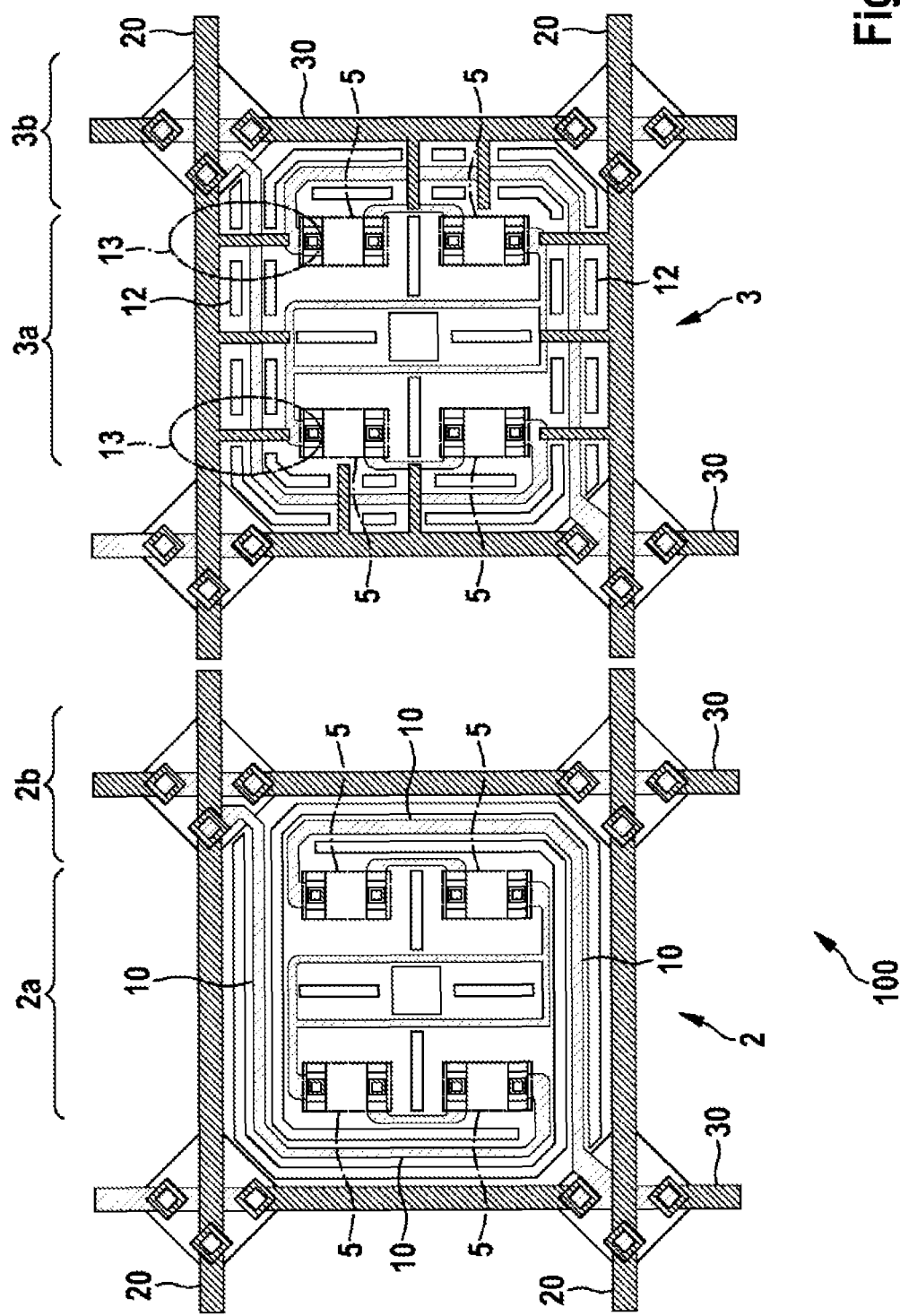
FIG. 2 shows a plan view of one embodiment of the infrared sensor device according to the disclosure.

FIG. 2 shows a schematic plan view of an embodiment of an infrared sensor device 100 according to the disclosure.

The sensor element 2 and the calibration element 3 respectively have, for example, a total of four diodes 5, a minimum number of diodes 5 for the sensor element 2 and for the calibration element 3 being one. The diodes 5 are electrically connected in series and/or parallel inside the aforementioned elements 2, 3.

Anchoring (not represented) of the suspension arrangement 10 on the semiconductor substrate 1 is carried out at engagement points of suitable anchor structures 2*b* and 3*b*. Examples of such structures are support columns and/or support walls (not represented) between the individual pixel regions 2*a*, 3*a* of the sensor elements 2, 3, respectively, the support columns or support walls being formed from semiconductor substrate material.

FIG. 2 shows by way of example two row lines 20 and two column lines 30 crossing over/under, which represent electrical supply or address arrangements (not shown) of sensor elements 2 and calibration elements 3 in a sensor array. Preferably, one row of calibration elements 3 is in this case provided per array of sensor elements 2. In this way, each row or column of an array receives at least one calibration element 3.

In the plan view of the calibration element 3, it can be seen that the thermal bridges 13 represent a suspension region of the calibration element 3 on the semiconductor substrate 1. Sacrificial layer etching holes 12, which are used for undercut etching of the suspension arrangement, can be seen between the thermal bridges 13. Compared with the suspension arrangement 10 of the sensor element 2, the suspension region of the calibration element 3 is formed more solidly and as a short, direct highly thermally conductive connection between column or row line region and diode region 5, so that stronger thermal coupling of the semiconductor substrate 1 to the calibration element 3 is produced.

Figure 3A:
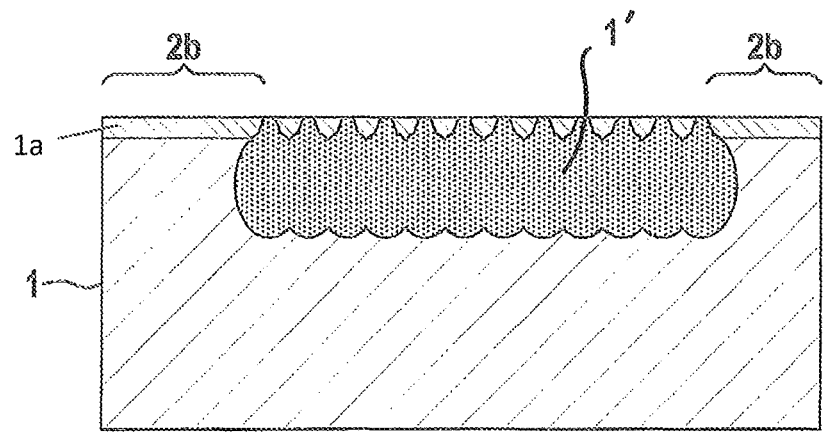
FIG. 3a to FIG. 3d show method sections of a method for producing one embodiment of the infrared sensor device according to the disclosure with corresponding intermediate products.

FIG. 3*a* shows an intermediate product of a first step of a method for producing a sensor element 2 of the infrared sensor device 100 according to the disclosure. A semiconductor substrate 1 is provided, which is preferably formed as a monocrystalline silicon. By means of a doping-selective etching process using a grid-shaped etching mask, a surface micromechanical membrane 1*a* with anchor structures 2*b* is produced. In this case, substrate material 1' that is not n-type doped is porously etched. Subsequent to this, the porous silicon 1' is relocated, or selectively removed, so that a cavity in the form of a cavern 8 is formed.

Figure 3B:
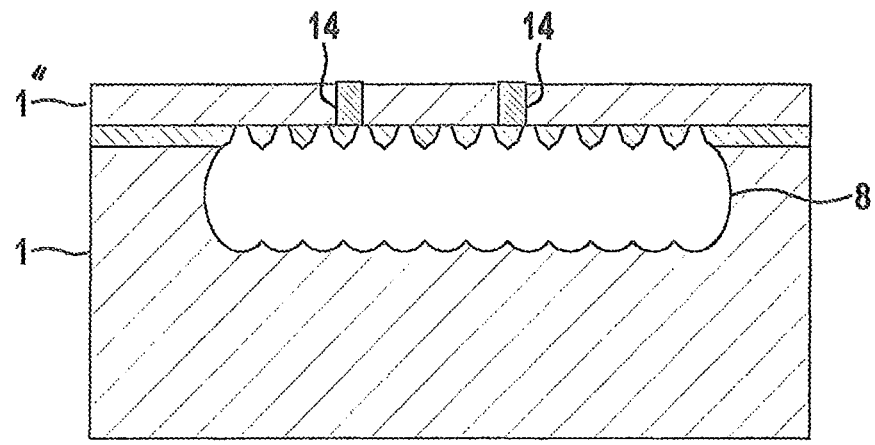

FIG. 3*b* shows an intermediate product of a subsequent epitaxial step, in which an additional semiconductor substrate material 1" is grown on to the structure of FIG. 3*a*, so that a continuous membrane is obtained. In the grown semiconductor substrate material 1, dopings 14 are thereupon introduced in order to form the diodes 5. The cavern 8 is arranged below the epitaxially applied substrate layer.

Figure 3C:
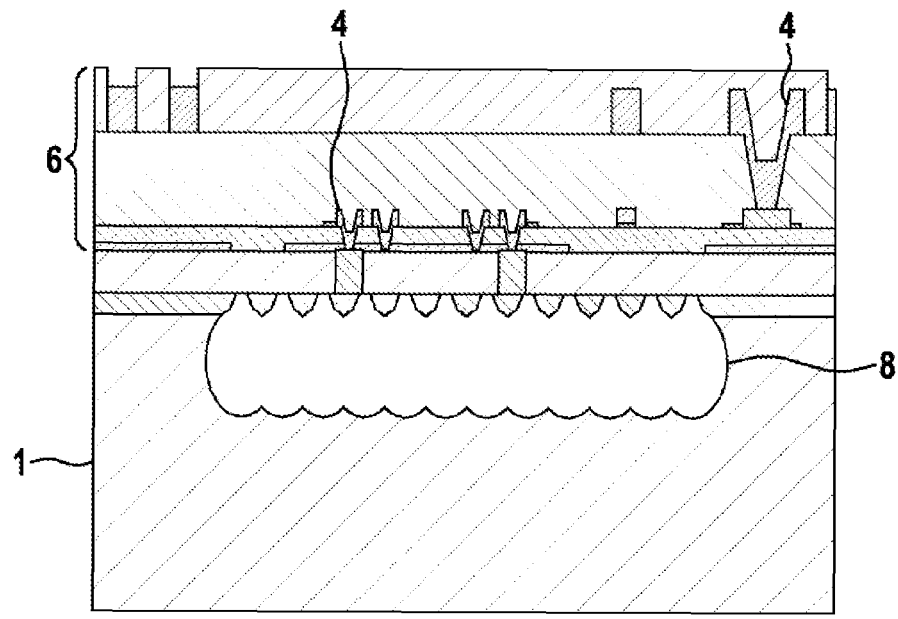

FIG. 3*c* shows an intermediate product of a subsequent production step, in which at least two layers of oxide material 6 with a total optical thickness of an odd multiple of one fourth of the wavelength to be detected are applied. Application and structuring of at least two conductive track layers for conductive tracks 4 of column and row wiring of a sensor array are also carried out. In this case, an interconnection plane for the conductive tracks 4 is deposited and structured inside the layers. In this way, conductive tracks 4 are obtained which may preferably have different materials. They comprise one or more of the materials: Ti, TiN, Ta, TaN or a combination of these materials.

Figure 3D:
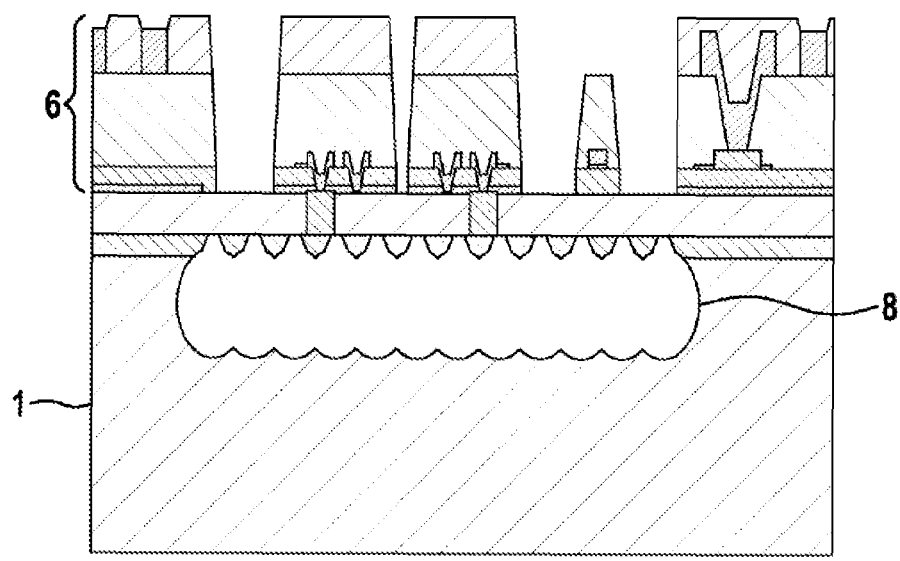

FIG. 3*d* shows an outline of structuring of the suspension arrangement 10 and introduction of sacrificial layer etching holes through the multilayer oxide layer. In a subsequent optional step, a part of the oxide layer thickness may be removed by means of a conductive track sacrificial layer process in the region of the suspension arrangement 10 (for the sensor element 2) and in the pixel region 3a (for the calibration element 3). In this way, the oxide layer is formed more thinly in the region of the aforementioned structures.

As a result of the sacrificial layer etching, a spatially substantially exposed sensor element 2, or calibration element 3, is obtained, which is thermally insulated from the surrounding semiconductor substrate 1 by a cavern 8 arranged below the sensor element 2, or the calibration element 3, respectively. Furthermore, undercut etching of the layers of oxide material 6 is carried out so as to form, or expose, the suspension arrangement 10 for the sensor element 2.

In a next production step (for example FIG. 1, left), a time-controlled sacrificial layer etching, preferably substantially isotropic in a first step, of the semiconductor substrate material of the membrane is carried out at least until the silicon is removed below the suspension structures. In a second optional step, anisotropic sacrificial layer etching, above all directed depthwise, is carried out in order to produce a mesa structure below the pixel region 2a at the cavern bottom. By means of the mesa structure (Spanish, la mesa) a table-like focusing arrangement 7 (see FIG. 4) is provided, which acts as a waveguide and is advantageously used to focus the incident radiation S onto the diodes 5 of the sensor element 2. As a result, less diffuse and more directed radiation strikes the sensor element 2.

Figure 4:
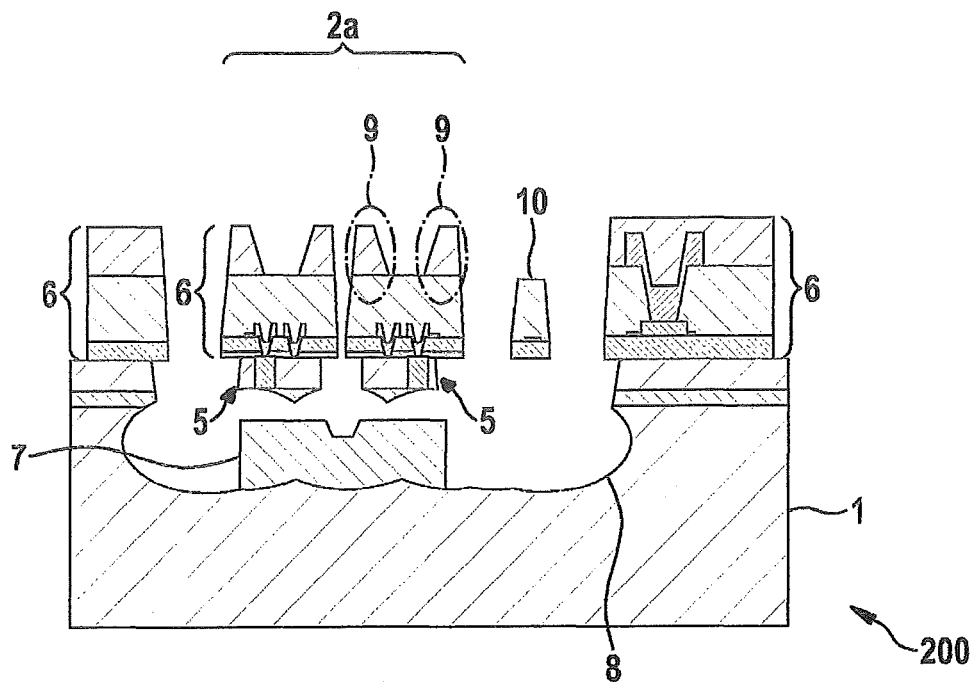
FIG. 4 shows a cross-sectional view of another embodiment of the infrared sensor device according to the disclosure.

FIG. 4 shows in cross section a possible further embodiment of the infrared sensor device 200 according to the disclosure. In this case, the layers of oxide material 6 may have bump-like elevations 9 in the pixel region 2a, which prevent bonding of the sensor element 2 on an overlying application-specific integrated circuit (ASIC) (not represented) to be mounted in a subsequent production step. Owing to the minimized contact surfaces, after contact of the pixel on the facing ASIC surface, any likelihood of bonding is greatly reduced.

FIG. 4 also shows the focusing arrangement 7, produced as a result of the aforementioned optional etching step the bottom of the cavern 8, which focuses the radiation to be detected on to the sensor element 2. In this way, the efficiency of the sensor element 2 can be significantly improved by increasing the signal/noise ratio. Of course, the infrared sensor device 200 may comprise the aforementioned elevations 9, or the focusing arrangement 7, in combination or respectively individually.

Figure 5:
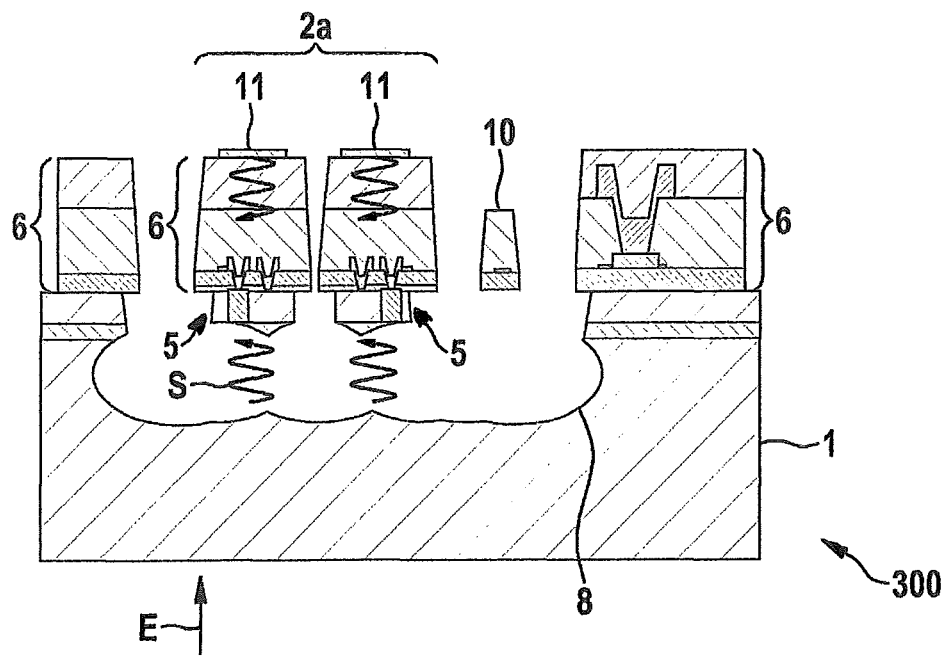
FIG. 5 shows a cross-sectional view of another embodiment of the infrared sensor device according to the disclosure.

FIG. 5 shows a cross-sectional view of another possible embodiment of the infrared sensor device 300 according to the disclosure, in which a reflector layer 11 (for example made of metal) is arranged on a surface of the oxide material 6 in the pixel region 2a. As an effect of the reflector layer 11, an absorption path of the radiation S to be detected, which preferably has an incidence direction E through a rear side of a wafer, can be lengthened. The distance traveled by the radiation S is substantially doubled by the absorbing oxide material 6, so that the absorbed power according to the Beer-Lambert law:

$$I(x) = I_0 * e^{-\lambda x}$$

is more than doubled. In this way, the absorption of the thermal radiation S inside the sensor element 2, and therefore the efficiency of the sensor element 2, can advantageously be increased.

In summary, the disclosure provides an improved infrared sensor device which is suitable for use in a sensor array, for example for use in thermography cameras. The disclosure may be used in all applications in which thermal radiation is to be detected with spatial resolution, and in which component costs are more important than high-precision temperature measurement. Examples are automobile night sight devices and thermography for building insulation or process monitoring. Furthermore, thermography cameras for household use (for example for locating insulation or heat leaks) may be produced with the disclosure. The infrared sensor device according to the disclosure may also be used as a single pixel for temperature monitoring by recording intrinsic thermal radiation of various objects, devices or living beings.

Advantageously, a pixel produced with the infrared sensor device according to the disclosure has low thermal coupling to the substrate by virtue of a small cross section of the suspension arrangement, a lack of thermal bridges and a thick absorber layer and/or reflector layer. Advantageously, a calibration element produced in the infrared sensor device according to the disclosure may significantly improve a sensing behavior of the sensor element, by substantially eliminating a distorting effect of a substrate temperature.

As a result, an infrared sensor device with highly sensitive image pixels, low thermal capacity, low thermal coupling to the substrate and therefore high image refresh frequency can be produced with the disclosure. Compared with conventional infrared sensor devices, the infrared sensor device according to the disclosure can be made smaller and therefore more economical with the same signal-to-noise ratio.

Although the present disclosure has been described with the aid of preferred exemplary embodiments, it is not restricted thereto. In particular, the materials and topologies mentioned are merely exemplary, and are not restricted to the examples explained. The person skilled in the art will thus be able to modify the described features of the disclosure or combine them with one another, without departing from the core of the disclosure.

The invention claimed is:

1. An infrared sensor device, comprising:
   a semiconductor substrate;
   a plurality of electrically conductive column lines and/or a plurality of electrically conductive row lines associated with the substrate;
   at least one micromechanically formed sensor element in the semiconductor substrate;
   at least one micromechanically formed calibration element in the semiconductor substrate, the calibration element being configured for the sensor element and including a diode region; and
   a suspension arrangement supporting said sensor element and said calibration element relative to said semiconductor substrate,
   wherein an absorber material is arranged on the semiconductor substrate in the region of the sensor element and of the calibration element,
   wherein a cavern is respectively formed in the semiconductor substrate substantially below the sensor element and substantially below the calibration element,
   wherein the sensor element and the calibration element are separated from the rest of the semiconductor substrate by the caverns,
   wherein the calibration element is thermally coupled to the semiconductor substrate by thermal bridges, between regions of said column lines or row lines and said diode region;

wherein the sensor element is not thermally coupled to the semiconductor substrate by thermal bridges between regions of said column lines or row lines, and wherein the thermal bridges are separate from said suspension arrangement.

2. The infrared sensor device as claimed in claim 1, wherein the semiconductor substrate is a monocrystalline silicon substrate, and wherein at least one diode is respectively formed in the semiconductor substrate for the sensor element and for the calibration element.

3. The infrared sensor device as claimed in claim 1, wherein the sensor element is fastened in two regions on the semiconductor substrate by a suspension arrangement.

4. The infrared sensor device as claimed in claim 3, wherein the suspension arrangement is formed substantially symmetrically in the vertical direction, wherein an electrical conductive track in the suspension arrangement is arranged substantially centrally between two substantially equally thick layers of the absorber material, and wherein the conductive track is covered laterally by the absorber material.

5. The infrared sensor device as claimed in claim 3, wherein the absorber material has a smaller layer thickness in the region of the suspension arrangement of the sensor element and at least a portion of the absorber material in the region of the diodes of the calibration element has a smaller thickness than in the rest of the calibration element.

6. The infrared sensor device as claimed in claim 1, wherein an optical thickness of the absorber material arranged on the sensor element substantially corresponds to an odd multiple of one fourth of a wavelength of a radiation to be detected.

7. The infrared sensor device as claimed in claim 1, wherein the absorber material is an oxide.

8. The infrared sensor device as claimed in claim 1, wherein a reflector layer is arranged on the absorber material on an exposed surface of the sensor element.

9. The infrared sensor device as claimed in claim 4, wherein a material of the electrical conductive track is at least one from the group: Ti, TiN, Ta, TaN and/or a combination of two or more of Ti, TiN, Ta, and TaN.

10. The infrared sensor device as claimed in claim 1, wherein a focusing arrangement is formed substantially below the sensor element at the bottom of the cavern, the focusing arrangement being configured to focus the radiation to be detected by the sensor element.

11. The infrared sensor device as claimed in claim 1, wherein the absorber material is formed with bumps on top on at least one section of a surface of the sensor element and of the calibration element.

12. An infrared sensor array having a plurality of electrically conductive column and row lines, comprising:
a plurality of infrared sensor devices, the infrared sensor devices including:
a semiconductor substrate;
at least one micromechanically formed sensor element in the semiconductor substrate;
at least one micromechanically formed calibration element in the semiconductor substrate, the calibration element being configured for the sensor element and including a diode region; and
a suspension arrangement supporting said sensor element and said calibration element relative to said semiconductor substrate,
wherein an absorber material is arranged on the semiconductor substrate in the region of the sensor element and of the calibration element,
wherein a cavern is respectively formed in the semiconductor substrate substantially below the sensor element and substantially below the calibration element,
wherein the sensor element and the calibration element are separated from the rest of the semiconductor substrate by the caverns,
wherein the calibration element is thermally coupled to the semiconductor substrate by thermal bridges, between column or row line regions and said diode region;
wherein the sensor element is not thermally coupled to the semiconductor substrate by thermal bridges between regions of said column lines or row lines, and
wherein the thermal bridges are separate from said suspension arrangement.

13. The infrared sensor array as claimed in claim 12, wherein each row or column of the sensor array comprises at least one calibration element.

14. The infrared sensor device as claimed in claim 1, wherein the thermal bridges contain a metal structure to increase the thermal conductivity.

15. The infrared sensor device as claimed in claim 1, wherein the absorber material is a silicon oxide.

* * * * *